United States Patent
Shin

(10) Patent No.: US 7,872,939 B2
(45) Date of Patent: Jan. 18, 2011

(54) SEMICONDUCTOR MEMORY DEVICE

(75) Inventor: Beom-Ju Shin, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 359 days.

(21) Appl. No.: 12/005,551

(22) Filed: Dec. 26, 2007

(65) Prior Publication Data

US 2008/0285374 A1 Nov. 20, 2008

(30) Foreign Application Priority Data

May 14, 2007 (KR) ...................... 10-2007-0046379

(51) Int. Cl.
*G11C 8/00* (2006.01)
(52) U.S. Cl. ...................... 365/230.08; 365/145; 365/63
(58) Field of Classification Search ............ 365/230.08, 365/145, 63, 201, 230.03, 189.03, 189.05, 365/189.07, 230.02
See application file for complete search history.

(56) References Cited

U.S. PATENT DOCUMENTS

| 5,561,639 | A | * | 10/1996 | Lee et al. ................ 365/230.06 |
| 5,809,228 | A | * | 9/1998 | Langendorf et al. ........... 714/53 |
| 6,909,624 | B2 | * | 6/2005 | Sadakata et al. ............... 365/63 |
| 2006/0077703 | A1 | * | 4/2006 | Miyakawa et al. .......... 365/145 |

FOREIGN PATENT DOCUMENTS

KR 10-0646202 B1 11/2006

* cited by examiner

*Primary Examiner*—Dang T Nguyen
(74) *Attorney, Agent, or Firm*—Blakely, Sokoloff, Taylor & Zafman

(57) ABSTRACT

A semiconductor memory device includes: a first address buffer configured to be used in a test mode and a normal mode and to receive more addresses in the test mode than in the normal mode; and a second address buffer configured to be used in the normal mode and disabled in the test mode.

11 Claims, 5 Drawing Sheets

SEMICONDUCTOR MEMORY DEVICE

CROSS-REFERENCE TO RELATED APPLICATIONS

The present invention claims priority of Korean patent application number 10-2007-0046379, filed on May 14, 2007, which is incorporated by reference in its entirety.

BACKGROUND OF THE INVENTION

The present invention relates to a semiconductor memory device, and more particularly, to an address buffer of a semiconductor memory device.

FIG. 1 is a timing diagram illustrating an active operation and a read operation of a double data rate (DDR) 2 memory device.

As shown, the DDR2 memory device receives data in a DDR mode, but receives addresses and command signals in a single data rate (SDR) mode. That is, data are inputted at both a rising edge and a falling edge of a clock signal, and addresses and command signals are inputted only at a rising edge of a clock signal, just like an SDRAM.

The DDR2 memory device receiving two bank addresses BA<0:1> and fourteen addresses ADDR<0:13> are illustrated. That is, sixteen bits are used to receive the addresses, and sixteen channels and pins are required to receive the addresses.

FIG. 2 is a circuit diagram of an address buffer of a conventional semiconductor memory device.

Two address buffers 210 and 220 receiving a first address ADDR_A and a second address ADDR_B are illustrated in FIG. 2. When the semiconductor memory device uses a total of sixteen addresses as shown in FIG. 1, sixteen address buffers are required.

The first address buffer 210 includes first and second latches 211 and 212, and the second address buffer 220 includes third and fourth latches 221 and 222. The first latch 211 latches the first address ADDR_A which is inputted when the clock signal CLK is at a low level, and outputs a first latched address TLA_A. The second latch 212 latches the first latched address TLA_A which is inputted when the clock signal CLK is at a high level, and outputs a first output address LAA_A. The third latch 221 latches the second address ADDR_B which is inputted when the clock signal CLK is at a low level, and outputs a second latched address TLA_B. The fourth latch 222 latches the second latched address TLA_B which is inputted when the clock signal CLK is at a high level, and outputs a second output address LAA_B. As illustrated in FIG. 1, the addresses BA and ADDR are aligned at the center of a rising edge of the clock signal CLK. Therefore, such addresses are received when the clock signal CLK is at a low level.

An operation timing of the first and second latched addresses TLA_A and TLA_B, and the first and second output addresses LAA_A and LAA_B outputted from the first to fourth latches 211, 212, 221 and 222 is illustrated in FIG. 1.

As described above, in the conventional semiconductor memory device, since the addresses are aligned at the rising edge of the clock signal CLK and then inputted to the semiconductor memory device, the first and second address buffers 210 and 220 are designed to receive the addresses in alignment with the rising edges of the clock signal CLK.

As is well known, a test is very important in a manufacturing process of the semiconductor memory device. A test time is directly associated with a manufacturing cost. The semiconductor memory device is tested using a variety of signals applied through a test apparatus. The number of channels of the test apparatus is limited. Hence, an important issue in the semiconductor memory device is to reduce the number of channels necessary for the test.

In other words, as the number of channels or pins necessary for the test decreases, the test apparatus can test a larger number of chips at a time. This will reduce the test time and the test cost.

SUMMARY OF THE INVENTION

Embodiments of the present invention are directed to providing a semiconductor memory device that can reduce a test time and a test cost by reducing the number of address pins necessary for a test.

In accordance with an aspect of the present invention, there is provided a semiconductor memory device, including: a first address buffer configured to be used in a test mode and a normal mode and to receive more addresses in the test mode than in the normal mode; and a second address buffer configured to be used in the normal mode and disabled in the test mode.

In accordance with another aspect of the present invention, there is provided a semiconductor memory device, including: a second address pin configured to receive addresses in a normal mode and receive no addresses in a test mode; and a first address pin configured to receive addresses in the normal mode and further receive addresses inputted in the test mode to the second address pin.

In accordance with still another aspect of the present invention, there is provided a semiconductor memory device, including: a first input unit configured to receive addresses at a first timing of a clock signal; and a second input unit configured to receive addresses at a second timing of the clock signal and enabled in response to a control signal.

DESCRIPTION OF SPECIFIC EMBODIMENTS

Hereinafter, a semiconductor memory device in accordance with the present invention will be described in detail with reference to the accompanying drawings.

Before describing the present invention, a structure and an operation of a latch used in a semiconductor memory device of the present invention will be explained.

Figure 1:
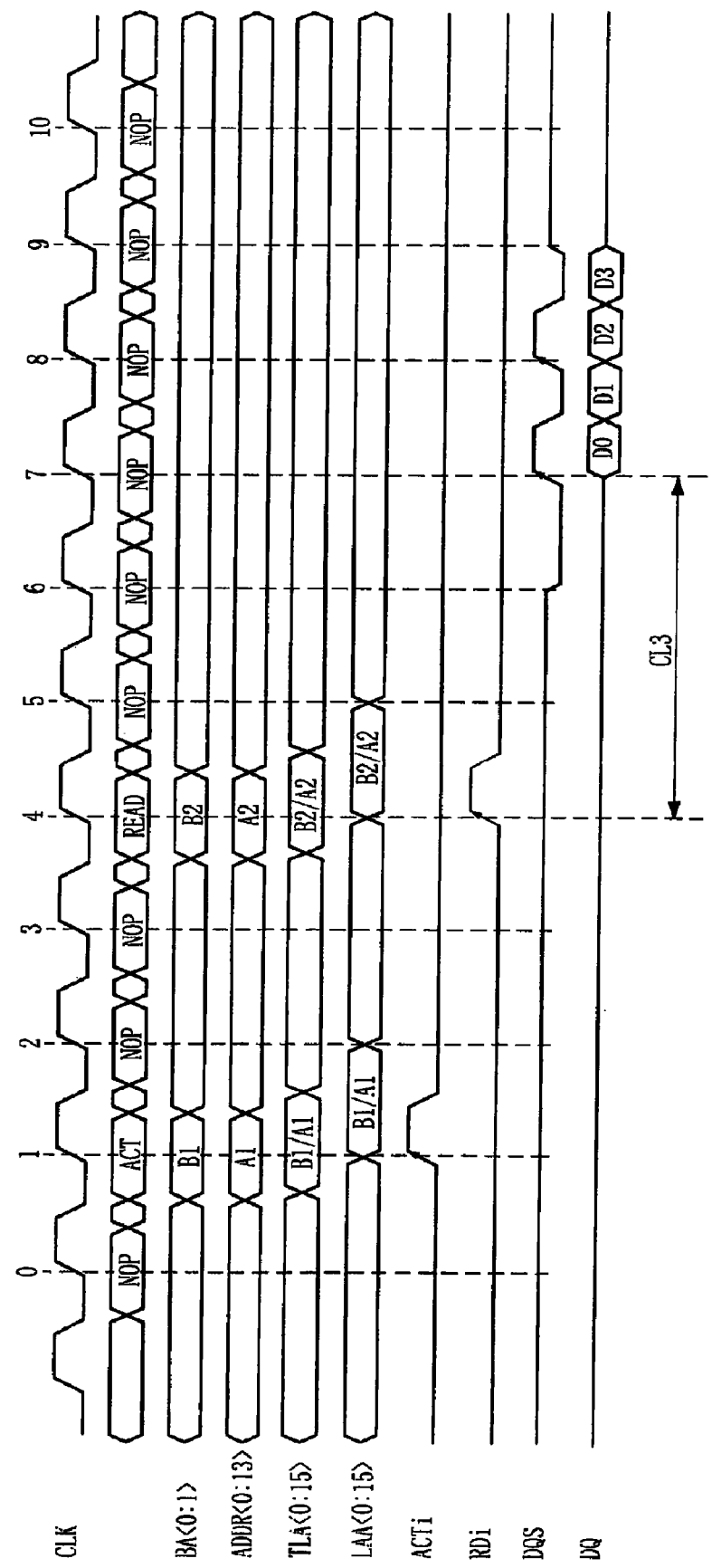
FIG. 1 is a timing diagram illustrating an active operation and a read operation of a double data rate (DDR) 2 memory device.
Figure 2:
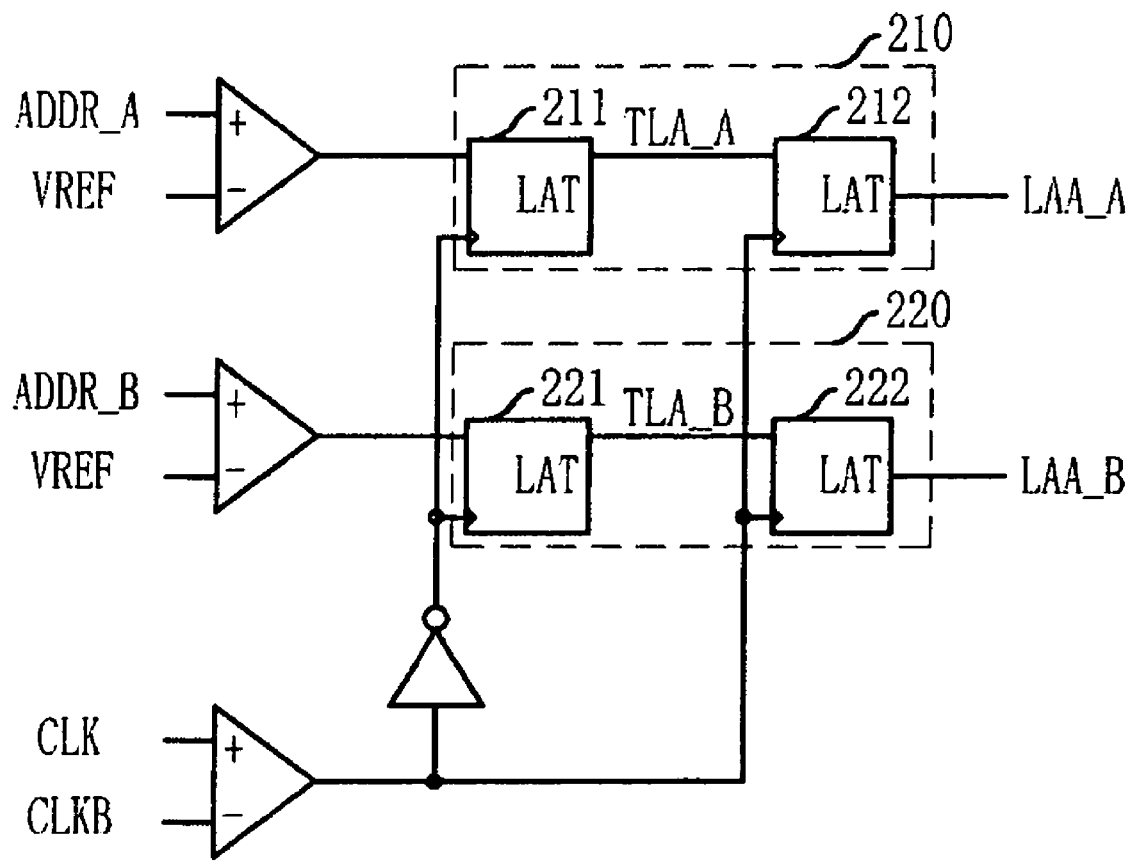
FIG. 2 is a circuit diagram of an address buffer of a conventional semiconductor memory device.
Figure 3:
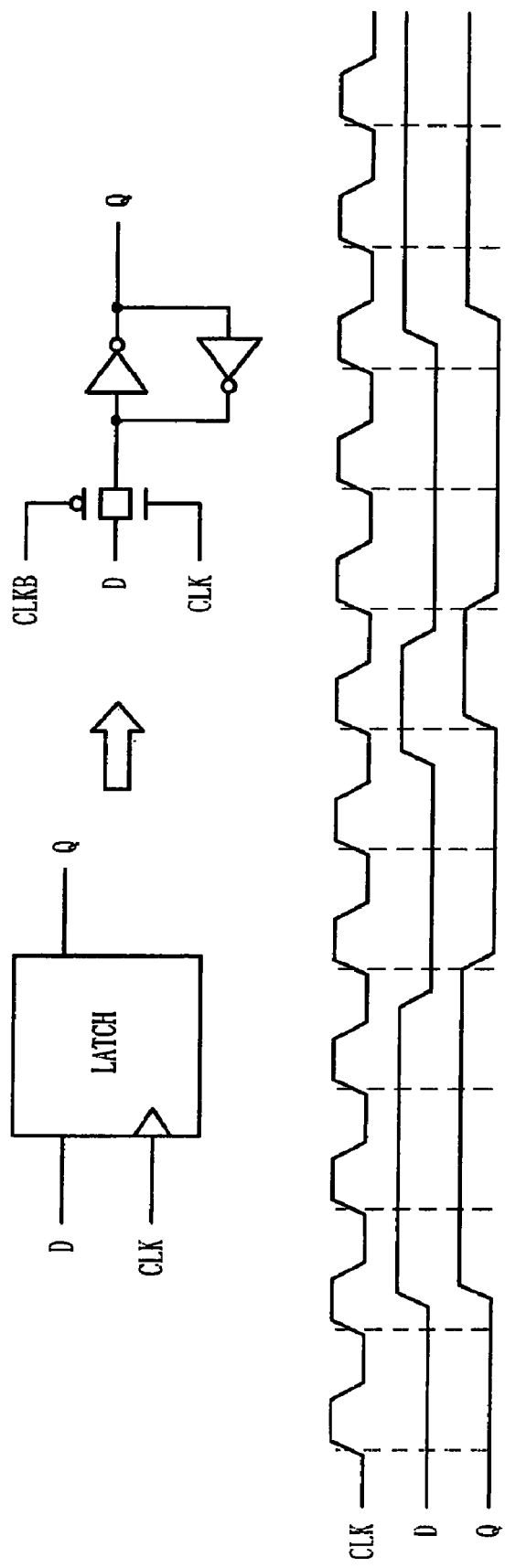
FIG. 3 is a diagram showing a structure and an operation of a latch used in a semiconductor memory device in accordance with an embodiment of the present invention.

FIG. 3 is a diagram showing a structure and an operation of a latch used in a semiconductor memory device in accordance with an embodiment of the present invention.

As shown, the latch includes a transfer gate and an inverter latch unit. When a clock signal CLK is inputted, the latch receives an input data D during a logic high level of the clock signal CLK, and fixes the input data D in synchronization with a falling edge of the clock signal CLK. On the contrary, when a clock bar signal CLKB is inputted, the latch receives an input data D during a logic low level of the clock signal CLK, and fixes the input data D in synchronization with a rising edge of the clock signal CLK.

Hereinafter, a case that the latch receives the input data D during a logic high level of the clock signal CLK is named as "in alignment with the falling edge of the clock signal CLK", and a case that the latch receives the input data D during a logic low level of the clock signal CLK is named as "in alignment with the rising edge of the clock signal CLK".

Figure 4:
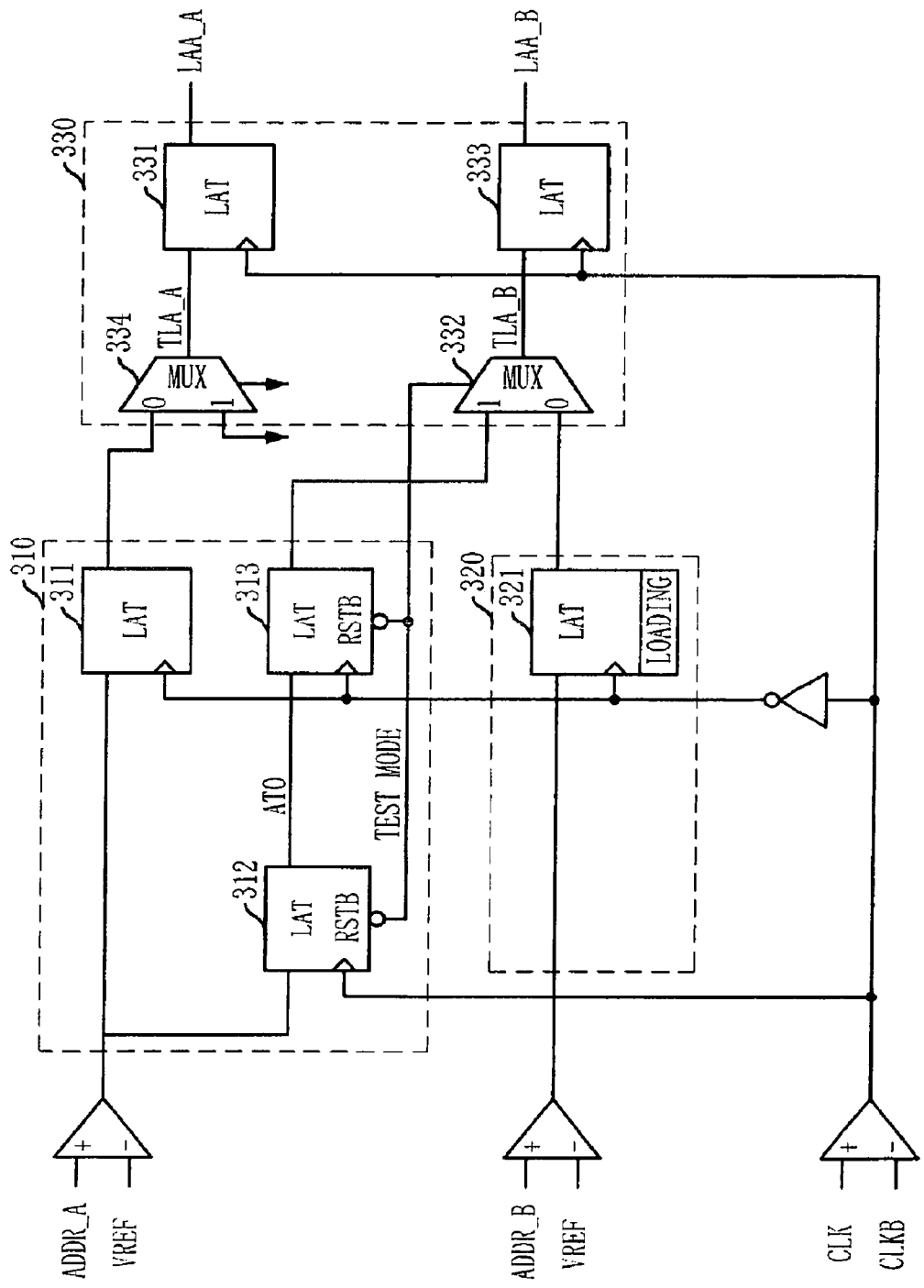
FIG. 4 is a circuit diagram of a semiconductor memory device in accordance with an embodiment of the present invention.

FIG. 4 is a circuit diagram of a semiconductor memory device in accordance with an embodiment of the present invention.

In the present invention, the semiconductor memory device receives addresses in alignment with a rising edge of a clock signal CLK in a normal mode, while the semiconductor memory device receives the addresses in alignment with both of the rising edge and a falling edge in a test mode. This means that the addresses can be inputted in alignment with the falling edge of the clock signal CLK in the normal mode, while they can be inputted in alignment with both of the falling edge and the rising edge of the clock signal CLK in the test mode. The reason for this is that the rising edges and the falling edges of the clock signal CLK have a relative meaning for discerning different states.

The semiconductor memory device includes a first address buffer 310 and a second address buffer 320. The first address buffer 310 is used in both the test mode and the normal mode, and receives more addresses in the test mode than those in the normal mode. The second address buffer 320 is used in the normal mode and is disabled in the test mode.

The semiconductor memory device may further include an address transfer unit 330 configured to transfer the addresses inputted through the first address buffer 310 and the second address buffer 320 in the normal mode, and transfer the addresses inputted through the first address buffer 310 in the test mode.

The first address buffer 310 receives the address in alignment with the rising edges of the clock signal CLK in the normal mode. On the other hand, the first address buffer 310 receives the addresses in alignment with the rising edges and the falling edges of the clock signal CLK in the test mode. In the normal mode, the addresses are inputted through a first address pin ADDR_A in alignment with the rising edges of the clock signal CLK in accordance with a specification of the semiconductor memory device. However, in the test mode, the addresses are inputted through the test apparatus. The test apparatus inputs the addresses to the first address pin ADDR_A in alignment with the rising edges and the falling edges, and the first address buffer 310 receives the inputted addresses. That is, the addresses inputted to a second address pin ADDR_B in the normal mode are further inputted through the first address pin ADDR_A in the test mode.

In detail, the first address buffer 310 includes a first latch 311, a second latch 312, and a third latch 313. The first latch 311 latches the addresses inputted in alignment with the rising edges of the clock signal CLK. The second latch 312 latches the addresses inputted in alignment with the falling edges of the clock signal CLK to thereby output a test address AT0, and is disabled in the normal mode. The third latch 313 aligns the test address AT0 at the rising edges of the clock signal CLK and is disabled in the normal mode. The reason why the second latch 312 and the third latch 313 are disabled in the normal mode is to prevent unnecessary current consumption in the normal mode.

The second address buffer 320 receives the addresses in alignment with the rising edges of the clock signal CLK in the normal mode, but the second address buffer 320 does not receive the addresses in the test mode because the addresses are not inputted through the second address pin ADDR_B.

The second address buffer 320 is used in the normal mode and is disabled in the test mode. This means that the second address buffer 320 is not used in the test mode because the addresses are not inputted through the second address pin ADDR_B in the test mode.

The second address buffer 320 may include a fourth latch 321 configured to latch the addresses inputted in alignment with the rising edges of the clock signal CLK in the normal mode and receive no addresses in the test mode. A word "loading" written in the fourth latch 321 represents that a loading is greatly designed in the second address buffer 320 so as to match with a loading of the first address buffer 310.

In the normal mode, the address transfer unit 330 transfers the addresses inputted to the first address buffer 310 to a path LAA_A, and transfers the addresses inputted to the second address buffer 320 to a path LAA_B. In the test mode, the address transfer unit 330 transfers the addresses inputted to the first address buffer 310 to the paths LAA_A and LAA_B through which the addresses are transferred in the normal mode. That is, the addresses inputted to the second address buffer 320 in the normal mode are inputted to the first address buffer 310 in the test mode, but the addresses inputted to the first address buffer 310 are transferred through the original path LAA_B.

The address transfer unit 330 includes a fifth latch 331, first and second multiplexers 332 and 334, and a sixth latch 333. The first latch 331 transfers a first address TLA_A stored in the first latch 311. In the normal mode, the first multiplexer 332 selects the address latched in the fourth latch 321 in response to a test signal TEST_MODE which is deactivated to a logic low level in the normal mode. In the test mode, the multiplexer 332 selects the address latched in the third latch 313 in response to the test signal TEST_MODE which is activated to a logic high level in the test mode. The sixth latch transfers a second address TLA_B outputted from the multiplexer 332.

In the address transfer unit 330, the second multiplexer 334 does not operate as a multiplexer, but it always selects the address latched in the first latch 311. The multiplexer 334 is provided to match a loading of the first address buffer 310 with a loading of the second address buffer 320. The multiplexer 334 may be configured with a combination of a transistor and a resistor, or a pass gate, which has the same loading.

Upon operation, the test signal TEST_MODE is deactivated to a logic low level in the normal mode, and the second latch 312 and the third latch 313 are disabled. The first address buffer 310 and the second address buffer 320 receive the addresses inputted in alignment with the rising edges of the clock signal CLK and transfer the received addresses to the respective paths LAA_A and LAA_B.

The test signal TEST_MODE is activated to a logic high level in the test mode, and the second latch 312 and the third latch 313 are enabled. The addresses are not inputted through the second address pin ADDR_B in the test mode, but the addresses are inputted through the first address pin ADDR_A in alignment with the rising and falling edges of the clock signal CLK. The first address buffer 310 receives the addresses inputted at the rising and falling edges of the clock signal CLK, and the multiplexer 332 transfers the addresses outputted from the third latch 313 and inputted at the falling edges of the clock signal CLK through the original path LAA_B.

The first latch 311 receives the addresses inputted in alignment with the rising edges of the clock signal CLK, and the second latch 312 receives the addresses inputted in alignment with the falling edges of the clock signal CLK. Accordingly, the first latch 311 receives the addresses in a period where the clock signal CLK is at a logic low level, and the second latch 312 receives the addresses in a period where the clock signal CLK is at a logic high level. Since the addresses are aligned at the center of the rising edge and the falling edge of the clock signal CLK, the addresses inputted in alignment with the rising edges are initially inputted in the period where the clock signal CLK is at the logic low level, and the addresses inputted in alignment with the falling edges of the clock signal CLK is initially inputted in a period where the clock signal CLK is at the logic high level.

The first address buffer 310 is designed to receive the addresses in alignment with the rising and falling edges of the clock signal CLK. It is apparent that a variety of designs are available, and the design of FIG. 4 is merely one example.

Although two buffers, i.e., the first and second address buffers 310 and 320, are illustrated in FIG. 4, the entire address buffer of the semiconductor memory device is not illustrated. Two kinds of the address buffer are merely illustrated in FIG. 4. The semiconductor memory device using sixteen address pins is configured with eight first address buffers 310 and eight second address buffers 320.

In view of the address pins, the semiconductor memory device includes a second address pin ADDR_B receiving the address in the normal mode and receiving no address in the test mode, and a first address pin ADDR_A receiving the address in the normal mode and further receiving the address inputted to the second address pin ADDR_B in the normal mode.

In the normal mode, the addresses aligned at the rising edges of the clock signal CLK are inputted through the first address pin ADDR_A and the second address pin ADDR_B. In the test mode, the addresses in alignment with the rising and falling edges of the clock signal CLK are inputted through the first address pin ADDR_A.

The first address pin ADDR_A and the second address pin ADDR_B are connected to the first address buffer 310 and the second address buffer 320, respectively.

In summary, the semiconductor memory device in accordance with the embodiments of the present invention includes the first input unit 311 configured to receive the addresses at a first timing of the clock signal CLK, the second input unit 312 configured to receive the addresses at a second timing and enabled in response to the control signal TEST_MODE, and the address pin ADDR_A, thereby reducing the number of address pins used in the test mode.

The first timing of the clock signal CLK may be the rising edge of the clock signal CLK. In this case, the second timing is the falling edge of the clock signal CLK. The first timing and the second timing mean the different phases.

Figure 5:
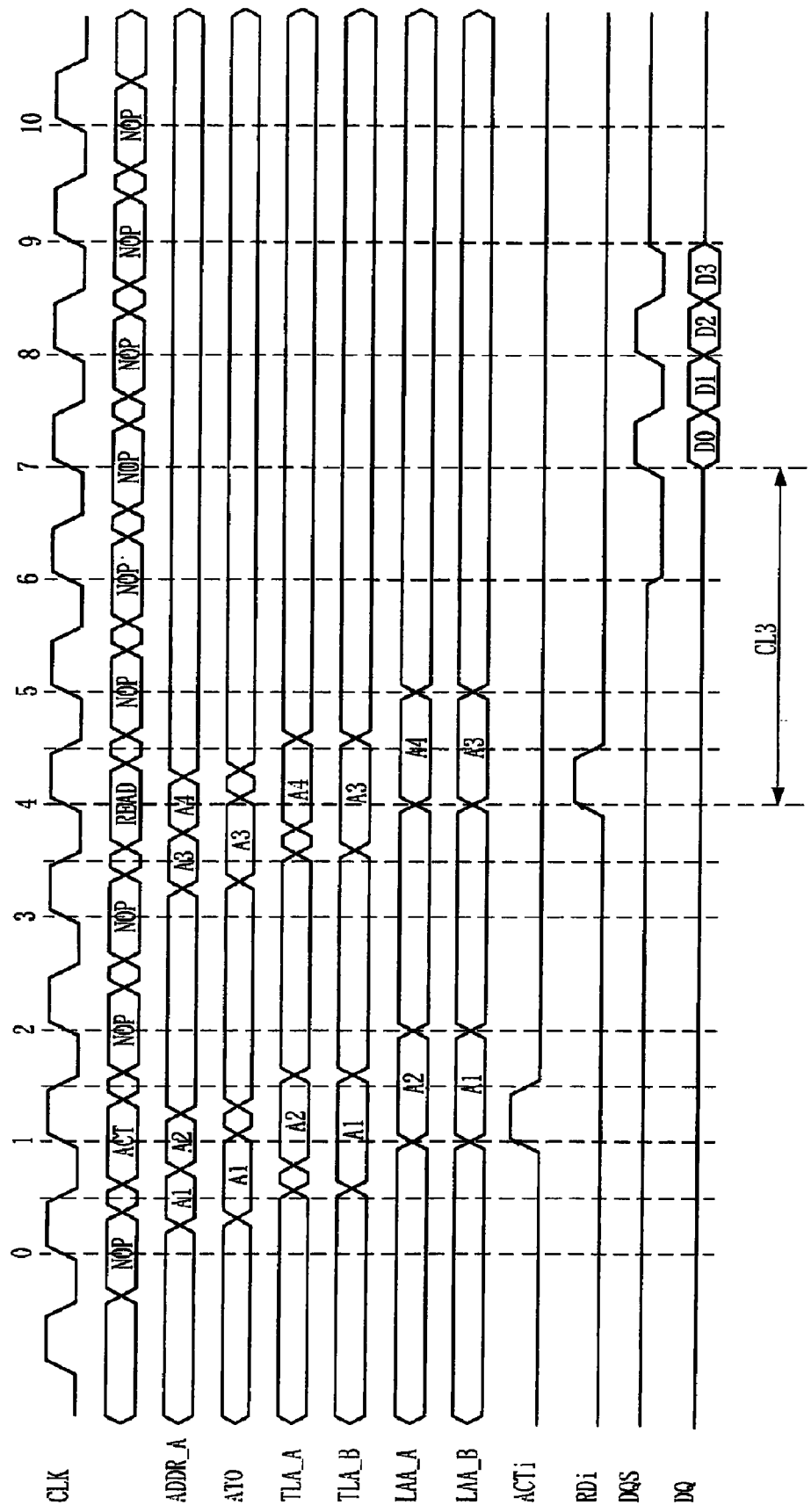
FIG. 5 is a timing diagram illustrating a test mode operation of the semiconductor memory device of FIG. 4.

FIG. 5 is a timing diagram illustrating the test mode operation of the semiconductor memory device of FIG. 4.

As shown, in the test mode, the address A1 inputted to the second address pin ADDR_B through the test apparatus in the normal mode is aligned with the falling edge of the clock signal CLK and inputted to the first address pin ADDR_A. Thus, the first address buffer 310 receives the addresses A1 and A2 inputted in alignment with the rising and falling edges of the clock signal CLK and aligns and output the addresses A1 and A2 through the paths LAA_A and LAA_B.

The address buffer operates in a way similar to a scheme of pre-fetching data in the test mode in the DDR memory device.

According to the conventional semiconductor memory device, the addresses are inputted at the rising edges and the address buffer receives the addresses at the rising edge of the clock signal CLK.

However, in accordance with the present invention, the first and second address buffers receive the addresses in the normal mode, but only the first address buffer receives the addresses in the test mode. That is, the address buffers receive the addresses at the rising edges of the clock signal CLK in the normal mode, and some of the address buffers receive the addresses at the rising and falling edges of the clock signal CLK in the test mode.

Since some of the address buffers operate in the DDR mode, the others need not operate. This means that the number of the address pins necessary for the test mode is reduced by half, compared with the normal mode.

The meaning of the rising edge and the falling edge is relative. The phrase "addresses are inputted in alignment with the rising/falling edges of the clock signal" may mean "addresses are aligned at the center of the rising/falling edges," or "addresses are inputted while the clock signal CLK are at the logic high/low levels. That is, in the following description, the rising/falling edges of the clock signal CLK or alignment at the rising/falling edges of the clock signal CLK are used as a relative meaning.

Although the first address buffer and the second address buffer use the latches for receiving the addresses, the first address buffer receiving the addresses at the rising/falling edges of the clock signal and the second address buffer receiving the addresses at the rising edge of the clock signal can also be configured with a variety of logic circuits, e.g., flip-flops.

In accordance with the present invention, the semiconductor memory device includes the first address buffer receiving more addresses in the test mode than in the normal mode, and the second address buffer that is not used in the test mode. The semiconductor memory device includes the first to fourth address buffers. The first address buffer receives the addresses intended to be inputted to the second to fourth address buffers.

The first and second address buffers are used in the normal mode, but only the first address buffer is used in the test mode. Hence, the number of the address pins necessary for the test mode is reduced by half, compared with the normal mode.

Consequently, the test apparatus can test a larger number of chips at a time, thereby reducing the test time and the test cost.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
   a first address buffer configured to be used in a test mode and a normal mode and to receive more addresses in the test mode than in the normal mode; and
   a second address buffer configured to be used in the normal mode and disabled in the test mode.

2. The semiconductor device as recited in claim 1, wherein the first address buffer receives addresses inputted in alignment with rising edges of a clock signal in the normal mode, and receives addresses inputted in alignment with rising and falling edges of the clock signal in the test mode.

3. The semiconductor device as recited in claim 2, wherein the second address buffer receives addresses inputted in alignment with the rising edges of the clock signal in the normal mode and receives no addresses in the test mode.

4. The semiconductor memory device as recited in claim 2, wherein the first address buffer comprises:
   a first latch configured to latch addresses inputted in alignment with the rising edges of the clock signal; and
   a second latch configured to latch addresses inputted in alignment with the falling edges of the clock signal and disabled in the normal mode; and
   a third latch configured to align the addresses latched in the second latch at the rising edges of the clock signal and disabled in the normal mode.

5. The semiconductor device as recited in claim 4, wherein the second address buffer comprises a fourth latch configured to latch addresses inputted in alignment with the rising edges of the clock signal in the normal mode and receive no addresses in the test mode.

6. The semiconductor memory device as recited in claim 5, wherein the address transfer unit comprises:
   a fifth latch configured to transfer the addresses latched in the first latch;
   a multiplexer configured to select the addresses latched in the fourth latch in the normal mode and the addresses latched in the third latch in the test mode; and
   a sixth latch configured to latch an output of the multiplexer.

7. The semiconductor device as recited in claim 1, further comprising:
   a first address pin through which the first address buffer receives the addresses; and
   a second address pin through which the second address buffer receives the addresses,
   wherein the addresses are inputted to the first and second address pins in the normal mode, and the addresses are inputted to only the first address pin in the test mode.

8. The semiconductor device as recited in claim 1, further comprising an address transfer unit configured to transfer addresses inputted through the first and second address buffers in the normal mode and to transfer addresses inputted through the first address buffer in the test mode.

9. The semiconductor device as recited in claim 8, wherein the first address buffer receives the addresses inputted to the first and second address buffers in the normal mode.

10. The semiconductor device as recited in claim 9, wherein the address transfer unit transfers the addresses, which are inputted to the first and second address buffers, through respective first and second paths in the normal mode, and transfers the addresses, which are inputted to the first address buffer, through a selected one of the first and second paths in the normal mode.

11. The semiconductor device as recited in claim 1, wherein the first address buffer receives twice as many addresses in the test mode than in the normal mode.

* * * * *